US006821689B2

(12) United States Patent
Pierrat

(10) Patent No.: US 6,821,689 B2
(45) Date of Patent: Nov. 23, 2004

(54) USING SECOND EXPOSURE TO ASSIST A PSM EXPOSURE IN PRINTING A TIGHT SPACE ADJACENT TO LARGE FEATURE

(75) Inventor: Christophe Pierrat, Santa Clara, CA (US)

(73) Assignee: Numerical Technologies, San Jose, CA (US)

( * ) Notice: Subject to any disclaimer, the term of this patent is extended or adjusted under 35 U.S.C. 154(b) by 169 days.

(21) Appl. No.: 10/244,451

(22) Filed: Sep. 16, 2002

(65) Prior Publication Data

US 2004/0053141 A1 Mar. 18, 2004

(51) Int. Cl.⁷ .............................................. G03F 9/00
(52) U.S. Cl. ......................................................... 430/5
(58) Field of Search ............................ 430/5, 311, 313, 430/322, 394; 716/19

(56) References Cited

U.S. PATENT DOCUMENTS

| 5,302,477 A | 4/1994 | Dao et al. ....................... 430/5 |
| 5,308,741 A | 5/1994 | Kemp ........................ 430/312 |

(List continued on next page.)

FOREIGN PATENT DOCUMENTS

| DE | 195 45 163 A1 | 6/1996 |
| EP | 0 653 679 A2 | 5/1995 |
| GB | 2333613 A | 7/1999 |
| JP | 62067547 | 3/1987 |
| JP | 2-140743 | 5/1990 |
| JP | 1283925 | 2/1991 |
| JP | 6-67403 | 3/1994 |
| JP | 8051068 | 2/1996 |
| JP | 8-236317 | 9/1996 |
| JP | 2638561 | 4/1997 |
| JP | 2650962 | 5/1997 |
| JP | 10-133356 | 5/1998 |
| JP | 11-143085 | 5/1999 |
| WO | WO 98/12605 A1 | 3/1998 |
| WO | WO 01/23961 A1 | 4/2001 |
| WO | WO 02/03140 A1 | 1/2002 |
| WO | WO 02/073312 A1 | 9/2002 |

OTHER PUBLICATIONS

Anonymous, "PSMLint—Phase Shifting Mask Physical Verification Level Type Checking", JPCOM000007351D, Mar. 18, 2002.
Anonymous, "PSM Library And Place And Route", IPCOM000007571D, Apr. 5, 2002 (10 pages).

(List continued on next page.)

Primary Examiner—S. Rosasco
(74) Attorney, Agent, or Firm—Park, Vaughan & Fleming LLP

(57) ABSTRACT

One embodiment of the present invention provides a system that uses an exposure through a second mask to assist an exposure through a phase shifting mask in printing a tight space adjacent to a large feature. During operation, the system exposes a photoresist layer on the surface of a semiconductor wafer through the phase-shifting mask. This phase-shifting mask includes phase shifters that define a space between a first feature and a second feature, wherein the first feature is so large that the effectiveness of phase shifting is degraded in defining the space. Moreover, the degradation in phase shifting and the tightness of the space cause the space not to print reliably when exposed through the phase shifting mask alone. To alleviate this problem the system exposes the photoresist layer through the second mask, wherein the exposure through the second mask assists in exposing the space between the first feature and the second feature so that the space prints reliably.

26 Claims, 6 Drawing Sheets

U.S. PATENT DOCUMENTS

| | | |
|---|---|---|
| 5,324,600 A | 6/1994 | Jinbo et al. ................... 430/5 |
| 5,364,716 A | 11/1994 | Nakagawa et al. ............ 430/5 |
| 5,472,814 A | 12/1995 | Lin ................................ 430/5 |
| 5,523,186 A | 6/1996 | Lin et al. ....................... 430/5 |
| 5,527,645 A | 6/1996 | Pati et al. ...................... 430/5 |
| 5,537,648 A | 7/1996 | Liebmann et al. .......... 395/500 |
| 5,538,815 A | 7/1996 | Oi et al. ........................ 430/5 |
| 5,565,286 A | 10/1996 | Lin ................................ 430/5 |
| 5,573,890 A | 11/1996 | Spence ........................ 430/311 |
| 5,595,843 A | 1/1997 | Dao ............................... 430/5 |
| 5,620,816 A | 4/1997 | Dao ............................... 430/5 |
| 5,635,316 A | 6/1997 | Dao ............................... 430/5 |
| 5,636,131 A | 6/1997 | Liebmann et al. .......... 364/490 |
| 5,702,848 A | 12/1997 | Spence .......................... 430/5 |
| 5,761,075 A | 6/1998 | Oi et al. ...................... 364/488 |
| 5,766,804 A | 6/1998 | Spence .......................... 430/5 |
| 5,766,806 A | 6/1998 | Spence .......................... 430/5 |
| 5,807,649 A | 9/1998 | Liebmann et al. ............ 430/5 |
| 5,858,580 A | 1/1999 | Wang et al. ................... 430/5 |
| 5,923,562 A | 7/1999 | Liebmann et al. .......... 364/488 |
| 5,923,566 A | 7/1999 | Galan et al. ................. 364/489 |
| 5,994,002 A | 11/1999 | Matsuoka ....................... 430/5 |
| 5,998,068 A | 12/1999 | Matsuoka ....................... 430/5 |
| 6,057,063 A | 5/2000 | Liebmann et al. ............ 430/5 |
| 6,066,180 A | 5/2000 | Kim et al. .................... 716/19 |
| 6,083,275 A | 7/2000 | Heng et al. ................... 716/19 |
| 6,130,012 A | 10/2000 | May et al. ..................... 430/5 |
| 6,139,994 A | 10/2000 | Broeke et al. ................. 430/5 |
| 6,185,727 B1 | 2/2001 | Liebmann .................... 716/19 |
| 6,228,539 B1 | 5/2001 | Wang et al. ................... 430/5 |
| 6,251,549 B1 | 6/2001 | Levenson .................... 430/11 |
| 6,258,493 B1 | 7/2001 | Wang et al. ................... 430/5 |
| 6,335,128 B1 | 1/2002 | Cobb et al. .................... 430/5 |
| 6,338,922 B1 | 1/2002 | Liebmann et al. ............ 430/5 |
| 6,420,074 B2 | 7/2002 | Wang et al. ................... 430/5 |
| 6,436,590 B2 | 8/2002 | Wang et al. ................... 430/5 |
| 2001/0000240 A1 | 4/2001 | Wang et al. ................... 430/5 |
| 2001/0028985 A1 | 10/2001 | Wang et al. ................... 430/5 |
| 2002/0083410 A1 | 6/2002 | Wu et al. ..................... 716/19 |
| 2002/0122994 A1 | 9/2002 | Cote et al. ..................... 430/5 |
| 2002/0127479 A1 | 9/2002 | Pierrat ........................... 430/5 |
| 2002/0129327 A1 | 9/2002 | Pierrat et al. ................. 716/19 |
| 2002/0136964 A1 | 9/2002 | Pierrat ........................... 430/5 |
| 2002/0142231 A1 | 10/2002 | Kling et al. ................... 430/5 |
| 2002/0142232 A1 | 10/2002 | Kling et al. ................... 430/5 |
| 2002/0144232 A1 | 10/2002 | Ma et al. ...................... 716/21 |
| 2002/0152454 A1 | 10/2002 | Cote et al. ................... 716/21 |
| 2002/0155363 A1 | 10/2002 | Cote et al. ..................... 430/5 |

OTHER PUBLICATIONS

Anonymous, "Non–Critical Blocking For Full Phase Masks", IPCOM000007568D, Apr. 5, 2002 (14 pages).

Anonymous, "Pull Phase Mask In Damascene Process", IPCOM000007569D, Apr. 5, 2002 (7 pages).

Liebmann, L., et al., "Enabling Alternating Phase Shifted Musk Designs For A Full Logic Gate Level", J. Microlith., Microfab., Microsyst., vol. 1, No. 1, pp. 31–42, Apr. 2002.

Borodovsky, Y., et al., "Lithography Strategy For 65nm Node", Intel, PMJ 2002, Yokohama, Japan, pp. 1–33, Apr. 23–25, 2002.

McCalluin, M., et al., "Alternating PSM Mask Performance—a Study of Multiple Fabrication Technique Results", International SEMATECH (6 pages).

Morikawa, Y., et al., "100nm–alt.PSM Structure Discussion for ArF Lithography", Dai–Nippon Printing Co., Ltd. (15 pages).

Ozaki, T., et al., "A 0.15um KrF Lithography for 1 Gb DRAM Product Using Highly Printable Patterns and Thin Resist Process", Toshiba Corporation (2 pages).

Rhyins, P., et al., "Characterization of Quartz Etched PSM Masks for KrF Lithography at the 100nm Node", Photronics, Inc., MIT Lincoln Lab, ARCH Chemicals. Finle Technologies. KLATencor Corp. (10 pages).

Rosenbluth, A., et al., "Optimum Mask and Source Patterns to Print a Given Shape", IBM (17 pages).

Schmidt, R., et al., "Impact of Cons on CD Control for Multiphase PSM Designs", AMD, ASML (10 pages).

Swell, H., et al., "An Evofuarion of the Dual Exposure Technique", SVG Lithography Systems Inc. (11 pages).

Spence, C., et al., "Optimization of Phase–Shift Mask Designs Including Defocus Effects", AMD, Princeton University, Vecor Technologies Inc. (8 pages).

Suzuki, A., et al., "Multilevel Imaging System Realizing k1—3 Lithography", Canon Inc. (13 pages).

Vandenberghe, G., et al., "(Sub–)100nm Gate Patterning Using 248nm Alternating PSM", IMEC, Mentor Graphics (9 pages).

Fritze, M., et al., "100–nm Node Lithography with KrF?", MIT Lincoln Lab. Numberical Technologies. Phottronics. Arch Chemicals (14 pages).

Fukuda, H.. et al., "Patterning of Random Interconnect Using Double Exposure of Strong–Type PSMs", Hitachi Central Research Lab (8 pages).

Ferguson. R.. et al., "Pattern–Dependent Correction of Mask Topography Effects for Alternating Phase–Shifting Masks", IBM Microelectronics, University of California Berkeley (12 pages).

Toublan, O., et al., "Phase and Transmission Errors Aware OPC Solution for PSM: Feasibility Demonstration", Mentor Graphics Corp. (7 pages).

Ackmann, P., et al., "Phase Shifting and Optical Proximity Corrections to Improve CD Control on Logic Devices in Manufacturing for Sub 0.35 um I–Line", SPIE. vol. 3051, pp. 146–153, Mar. 12–14, 1997.

Motsuoka, K., et al., "Application of Alternating Phase–Shifting Mask to 0.16um CMOS Logic Gate Patterns", Matsushita Electric Jnd. Co., Ltd. (9 pages).

Wang, R., et al., "Polarized Phase Shift Mask: Concept, Design, and Potential Advantages to Photolithography Process and Physical Design", Motorola Semiconductor Product Sector (12 pages).

Ogawa, K., et al., "Phase Defect Inspection by Differential Interforence", Lascrtec Corporation (12 pages).

Pistor, T., et al., "Rigorous 3D Simulations of Phase Defects in Alternating Phase–Shifting Masks", Panoramic Technology Inc. (13 pages).

Semmier, A., et al., "Application of 3D EMF Simulation for Development and Optimization of Alternating Phase Shifting Masks", Infineon Technologies AG (12 pages).

Wong, A., et al., "Polarization Effects in Mask Transmissions", University of California Berkeley (8 pages).

Erdmann, A., et al., "Topography Effects and Wave Aberrations in Advanced PSM–Technology", Fraunbofer Institute of Intergrated Circuits (11 pages).

Granik, Y., et al., "CD Variation Analysis Technique and its Application to the Study of PSM Mask Misalignment", Mentor Graphics (9 pages).

Hanyu, et al., "New Phase–Shifting Mask with Highly Transparent SiO2 Phase Shifters", Fujitsu Laboratories Ltd. (11 pages).

Ishiwata, N., et al., "Fabrication of Phase–Shifting Mask", Fujitsu Limited (11 pages).

Levenson, M., et al., "Phase Phirst! An Improved Strong–PSM Paradigm", M.D. Levenson Consulting, Peterson Advanced Lithography, KLA–Tencor (10 pages).

Levenson, M., et al., "SCAA Mask Exposures and Phase Phirst Design for 110nm and Below", M.D. Leveson Consulting, Canon USA, Inc.. JSR Microelectronics, Inc. (10 pages).

Lin, B.J., "The Relative Importance of the Building Blocks for 193nm Optical Lithography", Linnovation, Inc. (12 pages).

Yangaishita, Y., et al., "Phase–Shifting Photolithography Applicable to Real IC Patterns", Fujisu Limited (11 pages).

Levenson, M., et al., "Improving Resolution in Photolithography with a Phase–Shifting Mask", IEEE Transaction On Electron Devices, vol. ED–29, N. 12, pp. 1828–1836, Dec. 1982.

Levenson, M., et al., "The Phase–Shifting Mask II: Imaging Simulations and Submicometer Resist Exposure", IEEE Transactions on Electron Devices, vol. ED–31, No. 6, pp. 753–763, Jun. 1984.

Terasawa, T., et al., "0.3–Micron Optical Lithography Using a Phase–Shifting Mask", SPIE, Optical/Laser Microlithography II, vol. 1088, pp. 25–33, Mar. 1989.

Nitayama, A.. et al., "New Phase Shifting Mask with Self-–Aligned Phase Sifters for a Quarter Micron Photolithography", IEDM, pp. 3.3.1–3.3.4–Dec. 3–6, 1989.

Jinbo, H., et al., "0.2un or Less i–Line Lithography by Phase–Shifting–Mask Technology", IEEE, pp. 33.3.1–33.3.4 (1990).

Neureuther, A., "Modeling Phase Shifting Masks", SPIE 10th Annual Symposium On Microlithography, vol. 1496, pp. 80–85 (1990).

Yamanka, T et al., "A 5.9um2 Super Low Power SRAM Cell Using a New Phase–Shift Lithography", IEDM, pp. 18.3.1–18.3.4 (1990).

Inokuchi, K., et al., "Sub–Quarter Micron Gate Fabrication Process Using Phase–Shifting–Mask for Micowave GaAs Devices", Extended Abstracts Of The 1991 Intl. Conference On Solid State Devices And Materials, Yokohama, Japan, pp. 92–94 (1991).

Inokuchi, K., et al., "Sub–Quarter–Micron Gate Fabrication Process Using Phase–Shifting Mask for Microwave GaAs Devices", Japanese Journal Of Applied Physics, vol. 30, No. 12B, pp. 3818–3821, Dec. 1991.

Jinbo, H., et al., "Improvement of Phase–Shifter Edge Line Mask Method", Japanese Journal Of Applied Physics, vol. 30, No. 11B, pp. 2998–3003, Nov. 1991.

Kimura, T., et al., "Subhalf–Micron Gate GaAs Mesfet Process Using Phase–Shifting–Mask Technology", IEEE, GaAs IC Symposium, pp. 281–284 (1991).

Wiley, J., et al., "Phase Shift Mask Pattern Accuracy Requirements and Inspection Technology", SPIE, Integrated Circuit Metrology, Inspection, And Process Control V, vol. 1464, pp. 346–353 (1991).

Hirni, Y., et al., "Automatic Pattern Generation System for Phase Shifting Mask", 1991 Symposium on VLSI Technology, Digest of Technical Papers, pp. 95–96, May 28–30, 1991.

Wong, A.. et al.. "Investigating Phase–Shifting Mask Layout Issues Using a Cad Toolkit", IEEE, pp. 27.4.1–27.4.4 (1991).

Terasawa T., et al., "Imaging Characteristics of Multi–Phase–Shifting and Holftone Phase–Shifting Masks", Japanese Journal of Applied Physics, vol. 30, No. 11B, pp. 2991–2997, Nov. 1991.

Burggraaf, P., "Four More Significant Japanese Advances in Phase Shifting Technology", Semiconductor International, p. 16, Dec. 1991.

Kemp, K., et al., "Optimized Phase Shift Mask Designs for Real Devices", KTI Microlithography Seminar, pp. 67–75, Oct. 14–15, 1991.

Newmark, D., et al., "Phase–Shifting Mask Design Tool", SPIE—11th Annual BACUS Symposium on Photomask Technology, vol. 1604, pp. 226–235, Sep. 25–27, 1991.

Nitscher, C., et al., "Investigation of Self–Aligned Phase–Shifting Reticles by Simulation Techniques", SPIE—Optical/Laser Microlithography IV, vol. 1463, pp. 135–150 (1991).

Inoue, S., et al., "Simulation Study on Phase–Shifting Masks for Isolated Patterns", Japanese Journal of Applied Physics, vol. 30, No. 118, pp. 3010–3015, Nov. 1991.

Watanabe, H., et al., "Detection and Printability of Shifter Defects in Phase–Shifting Masks", Japanese Journal of Applied Physics, vol. 30, No. 11B, pp. 3016–3020, Nov. 1991.

Watanabe, H., et al., "Pattern Transfer Characteristics of Transparent Phase Shifting Mask", Japanese Journal of Applied Physics, vol. 30, No. 11B, pp. 3004–3009, Nov. 1991.

Jinbo, H., et al., "Applications of Blind Method of Phase–Shifting Lithography", IEEE, 1992 Symposium On VLSI Technology Digest Of Technical Papers, pp. 112–113 (1992).

Watanabe, H., et al., "Detection and Printability of Shifter Defects in Phase–Shifting Masks II Defocus Characteristics", Jpn. J. Appl. Phys., vol. 31, pp. 4155–4160 (1992).

Pierrat, C., et al., "Phase–Shifting Mask Topography Effects on Lithographic Image Quality", IEEE, pp. 3.3.3–3.3.4 (1992).

Burggraaf, P., "Lithography's Leeding Edge, Part I: Phase–Shift Technology and Part 2: I–Line and Beyond", Semiconductor International, pp. 43–47 and 52–56, Feb. 1992.

IBM, "Phase–Shift Mask Utilizing Silicon Oxy–Nitride as a Low Reflectivity Phase–Shift Layers", IBM Technical Disclosure Bulletin, vol. 34, No. 10B, pp. 360–361, Mar. 1992.

Brunner, T., et al., "170um Gates Fabricated by Phase–Shift Mask and Top Anti–Reflector Process", SPIE, Optical/Laser Microlithography VI. Vo. 1927, pp. 182–189 (1993).

Lin, B.J., "Phase–Shifting Masks Gain an Edge", IEEE Circuits & Devices, pp. 28–35, Mar. 1993.

Moniwa, A., et al., "Algorithm for Phase–Shift Mask Design with Priority on Shifter Placement", Jpn. J. Appl. Phys. vol. 32, Pt. 1, No. 12B, pp. 5874–5879, Dec. 1193.

Ooi, K., et al., "Computer Aidod Design Software for Designing Phase–Shifting Masks", Jpn. J. Appl. Phys., vol. 32, Pt. 1, No. 12B, pp. 5887–5891, Dec. 1993.

Ohtguka, H., et al., "Evaluation of Repair Phase and Size Tolerance for a Phase–Shift Mask", J. Vac. Sci. Technol. B. vol. 11, No. 6, pp. 2665–2668, Nov./Dec. 1993.

Ronse, K., et al., "Comparison of Various Phase Shift Stategies and Application to 0.35um ASIC Designs", SPIE—Optical/Laser Microlithography VI. vol. 1927, pp. 2–16 (1993).

Galan, G., et al., "Application of Alternating–Type Phase Shift Mask to Polysilicon Level for Random Logic Circuits", Jpn. J. Appl. Phys., vol. 33, pp. 6779–6784 (1994).

Mizuno, P., et al., "Practical Phase–Shifting Mask Technology for 0.3um Large Scale Integrations", J. Vac. Sci. Technol. B. vol. 12, No. 6, pp. 3799–3803, Nov./Dec. 1994.

Pati, Y.C., et al.. "Phase–Shifting Masks for Microlithography: Automated Design and Mask Requirements", J. Opt. Soc. Am., vol. 11, No. 9, pp. 2438–2452, Sep. 1994.

Stirniman, J., et al., "Wafer Proximity Correction and Its Impact on Mask–Making", Bacus News, vol. 10, Issue 1, pp. 1.3–7, Jan. 10–12, 1994.

Waas, T., et al., "Automatic Generation of Phase Shift Mask Layouts", Microelectronic Engineering, vol. 23, pp. 139–142 (1994).

Barouch, E., et al., "OPTIMASK: An OPC Algorithm for Chrome and Phase–Shift Mask Design", SPIE, Vo. 2440, pp. 192–206, Feb. 1995.

Moniwa, A., et al., "Heuristic Method for Phase–Conflict Minimization in Automatic Phase–Shift Mask Design", Jpn. J. Appl. Phys., vol. 34, Pt. 1, No. 12B, pp. 6584–6589, Dec. 1995.

Langston, J., et al., "Extending Optical Lithography to 0.25um and Below", Solid State Technology, pp. 57–64, Mar. 1995.

Nagshiro, Y., et al., "Improved Mask Technique for Photolithography Applied to 0.25um LSI—Improvement of Resolution, Pattern Correction Exposures Area", Nikkei Microdevices, pp. 1–6, Apr. 1995.

Okamoto, Y., et al., "A New Phase Shifting Mask Technology for Quarter Micron Photolithography", SPIE, vol. 2512, pp. 311–318, (1995).

Pierrat, C., et al., "Required Optical Characteristics of Materials for Phase–Shifting Masks", Applied Optics, vol. 34, No. 22, pp. 4923–4928, Aug. 1, 1995.

Galan, G., et al., "Alternating Phase Shift Generation for Coplex Circuit Designs", SPIE, vol. 2884, pp. 508–519, Sep. 18–20, 1996.

Kanai, H., et al., "Sub–Quarter Micron Lithography with the Dual–Trench Type Alternating PSM"—SPIE, vol. 2793, pp. 165–173 (1996).

Ishiwata, N., et al., "Novel Alternating Phase Shift Mask with Improved Phase Accuracy", SPIE, Proceedings Of The 17th Annual Symposium On Photomask Technology And Mangements, vol. 3236, pp. 243–249 (1997).

Morinoto, H., et al., "Next Generation Mask Strategy—Technologies are Ready for Mass Production of 256MDRAM?", SPIE, vol. 3236, pp. 188–189 (1997).

Raman, B., et al., "Implications of Device Processing on Photomask CD Requirements", SPIE, vol. 3236 (1997) (Abstract Only).

Nakne, A., et al., "A Proprosal for Pattern Layout Rule in Application of Alternating Phase Shift Mask", SPIE, vol. 3096, pp. 362–374 (1997).

Tsujimoto, E., et al., "Hierarchical Mask Data System (PROPHET) for Aerial Image Simulation, Automatic Phase–Shifter Placement, and Subpeak Overlap Checking", SPIE, vol. 3096, pp. 163–172 (1997).

Yamamoto, K., et al., "Hierarchical Processing of Levenson–Type Phase Shifter Generation", Jpn. J. Appl. Phys., vol. 36, Part I, No. 12B, pp. 7499–7503, Dec. 1997.

Gordon, R., et al., "Design and Analysis of Manufacturable Alternating Phase–Shifting Masks", Bacus News, vol. 14, Issue 12, pp. 1–9, Dec. 1998.

Nara, M., et al., "Phase Controllability Improvement for Alternating Phase Shift Mask", Dai Nippon Printing Co.. Ltd. (16 pages).

Ohnums, H., et al.. "Lithography Computer Aided Design Technology for Embedded Memory in Logic", Jpn. J. Appl. Phys., vol. 37, Part I, No. 12B, pp. 6686–6688, Dec. 1998.

Fukuda, H., et al., "Node–Connection/Quantum Phase–Shifting Mask: Path to Below 0.3um Pitch, Proximity Effect Free Random Interconnections and Memory Patterning", J. Vac. Sci. Technol. B, vol. 17, No. 6, pp. 3291–3295, Nov./Dec. 1999.

Spence, C., et al., "Intergration of Optical Proximity Correction Strategies in Strong Phase Shifters Design for Poly–Gate Layers", Becus News, vol. 15, Issue 12, pp. 1, 4–13, Dec. 1999.

Kuo, C., et al., "Extension of Deep–Ultraviolat Lithography for Patterning Logic Gates Using Alternating Phase Shifting Masks", J. Vac. Sci. Technol. B. vol. 17, No. 6, pp. 3296–3300, Nov./Dec. 1999.

Palmer, S., et al., "Dual Mask Model–Based Proximity Correction for High Performance 0.10um CMOS Process", The 44th Int'l Conference on Electron. Ion & Photon Beam Tech. and Nanofabrication Abstracts, pp. 18–19, May 30–Jun. 2, 2000.

Pierrat, C., "Investigation of Proximity Effects in Alternating Aperture Phase Shifting Masks", Numerical Technologies, Inc. (11 pages).

Kikuchi, K., et al., "Method of Expanding Process Window for the Double Exposure Technique with alit–PSMs", Optical Microlithography XIII. Proceedings of SPIE, vol. 4000, pp. 121–131 (2000).

Cooke, M., "OPC/PSM Designs For Poly Gate Layers", European Semiconductor, vol. 22, No. 7, pp. 57–59, Jul. 2000.

Granik, Y., et al., "Sub–Resolution Process Windows And Yield Estimation Technique Based On Detailed Fill–Chip CD Simulation", SPIE, vol. 4182, pp. 335–341 (2000).

Plat, M., et al., "The Impact of Optical Enchancement Techniques on the Mask Error Enhancements Function (MEEF)", SPIE, vol. 4000, pp. 206–214, Mar. 1–3, 2000.

Mansutipur, M., et al., "Projection Photolithography", Optics & Photonics News 11, 17 pages, Feb. 2000.

Cote, M., et al., "A Practical Application of Full–Feature Alternating Phase–Shifting Technology for a Phase–Aware Standard–Cell Design Flow", Numerical Technologies Inc. (6 pages).

Heng, F., et al., "Application of Automated Design Migration to Alternating Phase Shift Mask Design", IBM Research Report RC 21978 (98769), Feb. 26, 2001 (7 pages).

Wong, A., et al., "Alternating Phase–Shifting Mask with Reduced Aberration Sensitivity: Lithography Cosiderations", Proc. SPIE, vol. 4346, pp. 1–9 (2001).

Liebmann, L.W., et al., "TCAD Development For Lithography Resolution Enhancement", IBM J. Res, & Dev.. vol. 45, No. 5, pp. 651–655, Sep. 5, 2001.

USING SECOND EXPOSURE TO ASSIST A PSM EXPOSURE IN PRINTING A TIGHT SPACE ADJACENT TO LARGE FEATURE

BACKGROUND

1. Field of the Invention

The invention relates to the process of fabricating semiconductor chips. More specifically, the invention relates to a method and an apparatus for using a second exposure to assist a PSM (phase shifting mask) exposure in printing a tight space adjacent to a large feature during an optical lithography process for manufacturing a semiconductor chip.

2. Related Art

Recent advances in integrated circuit technology have largely been accomplished by decreasing the feature size of circuit elements on a semiconductor chip. As the feature size of these circuit elements continues to decrease, circuit designers are forced to deal with problems that arise as a consequence of the optical lithography process that is typically used to manufacture integrated circuits. This optical lithography process begins with the formation of a photoresist layer on the surface of a semiconductor wafer. A mask composed of opaque regions, which are generally formed of chrome, and light-transmissive clear regions, which are generally formed of quartz, is then positioned over this photoresist layer. (Note that the term "mask" as used in this specification is meant to include the term "reticle.") Light is then shone on the mask from a visible light source, an ultraviolet light source, or more generally some other type of electromagnetic radiation together with suitably adapted masks and lithography equipment.

This image is reduced and focused through an optical system containing a number of lenses, filters and mirrors. The light passes through the clear regions of the mask and exposes the underlying photoresist layer. At the same time, the light is blocked by opaque regions of the mask, leaving underlying portions of the photoresist layer unexposed.

The exposed photoresist layer is then developed, through chemical removal of either the exposed or non-exposed regions of the photoresist layer. The end result is a semiconductor wafer with a photoresist layer having a desired pattern. This pattern can then be used for etching underlying regions of the wafer.

Printing Problems with Large Features

As integration densities continue to increase, it is becoming desirable to use phase shifters to define more and more features within a layout. This can lead to problems in some situations. For example, the upper portion of FIG. 1 illustrates the phase shifters for a dark field alternating aperture phase shifting mask 102. The phase shifters (shown with slanted lines to indicate phase) would be set on a dark field, e.g. chromium. The white spaces between the phase shifters correspond to the intended, or original, layout. An aerial image 108 of the use of the PSM mask 102 along with a complementary trim mask (not shown) is in the bottom half of FIG. 1. The dark black regions of the aerial image are areas that received minimal exposure to light and correspond to what the printed wafer will look like. A comparison of the aerial image 108 and the PSM mask 102 can be instructive as to the intended layout.

The PSM mask 102 is being used to define a large feature 104, e.g. a contact landing pad. In this example, the distance between neighboring phase shifters 106 and 107 across feature 104 is large enough to degrade the effectiveness of phase shifting in defining the boundaries of feature 104. This causes a problem in reliably printing the tight space 105 adjacent to large feature 104, as is indicated in by the bridging that is visible in the aerial image 108.

What is needed is a method and an apparatus that facilitates reliably printing a tight space adjacent to a large feature that is defined by phase shifters.

SUMMARY

One embodiment of the present invention provides a system that uses an exposure through a second mask to assist an exposure through a phase shifting mask in printing a tight space adjacent to a large feature. During operation, the system exposes a photoresist layer on the surface of a semiconductor wafer through the phase-shifting mask. This phase-shifting mask includes phase shifters that define a space between a first feature and a second feature, wherein the first feature is so large that the effectiveness of phase shifting is degraded in defining the space. Moreover, the degradation in phase shifting and the tightness of the space cause the space not to print reliably when exposed through the phase shifting mask alone. To alleviate this problem the system exposes the photoresist layer through the second mask, wherein the exposure through the second mask assists in exposing the space between the first feature and the second feature so that the space prints reliably.

In a variation on this embodiment, the second mask includes an opening located over the space to assist in exposing the space on the photoresist layer. Note that this second exposure can be sub-resolution.

In a variation on this embodiment, the second mask additionally includes one or more additional assist features, which are not located over the space, yet assist in printing the space. Note that these assist features can be either in-phase or out-of-phase with the light passing through the opening in the second mask.

In a variation on this embodiment, if the second feature is a critical dimension feature, the opening in the second mask is offset from the second feature, so that alignment problems between the phase shifting mask and the second mask do not affect printing of the critical dimension feature.

In a variation on this embodiment, the system additionally performs an optical proximity correction (OPC) operation for segments on the phase shifting mask only.

In a variation on this embodiment, the system additionally performs an OPC operation for segments on the second mask only.

In a variation on this embodiment, the system additionally performs an OPC operation for segments on the phase shifting mask as well as segments on the second mask.

Note that the system may apply OPC to the second mask in a number of ways. (1) The system may perform an OPC operation only for segments on the second mask that abut an original layout. (2) The system may perform an OPC operation for any or all segments on the second mask.

DETAILED DESCRIPTION

Wafer Fabrication Process

Figure 1:
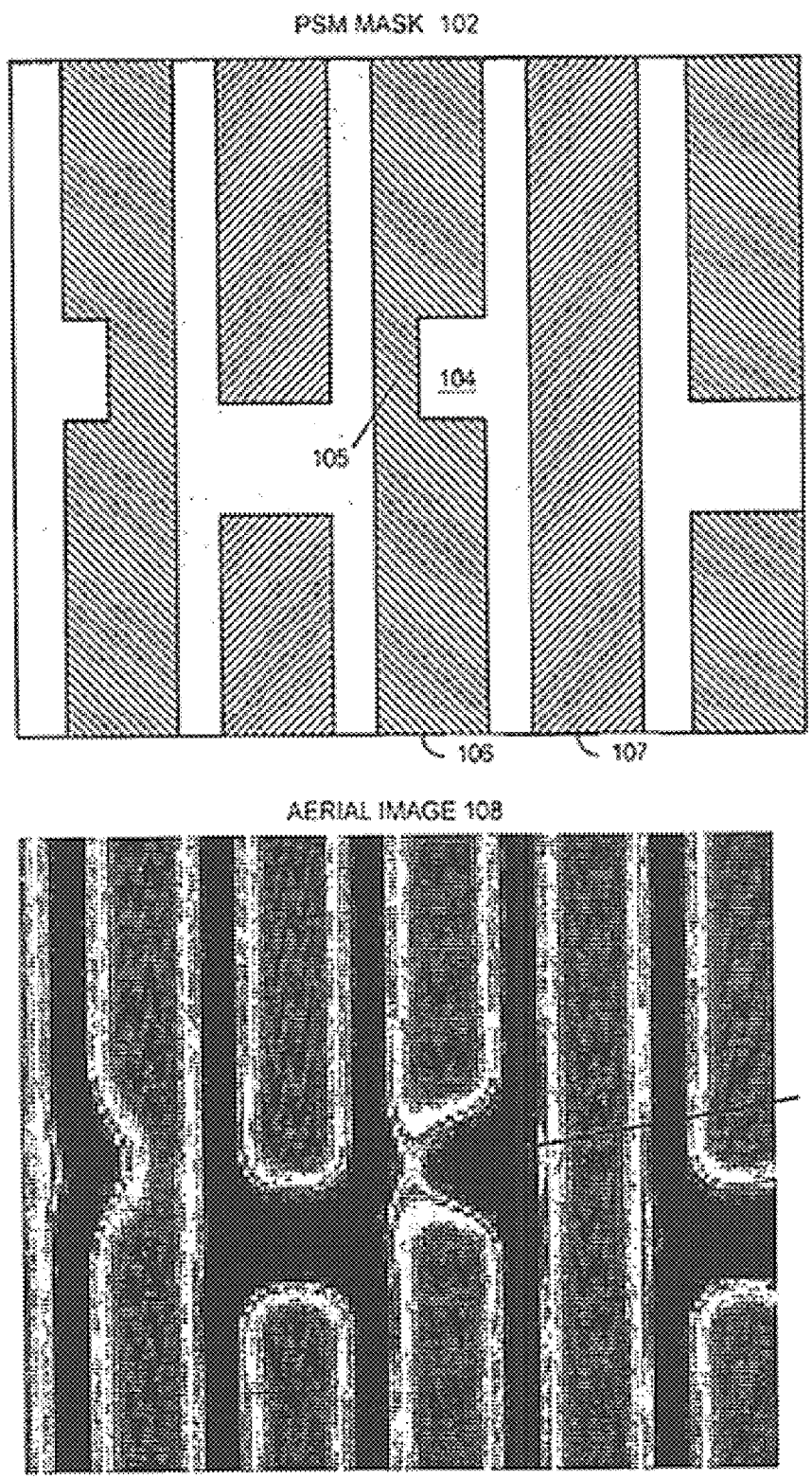
FIG. 1 illustrates the problem of printing a tight space adjacent to a large feature.
Figure 2:
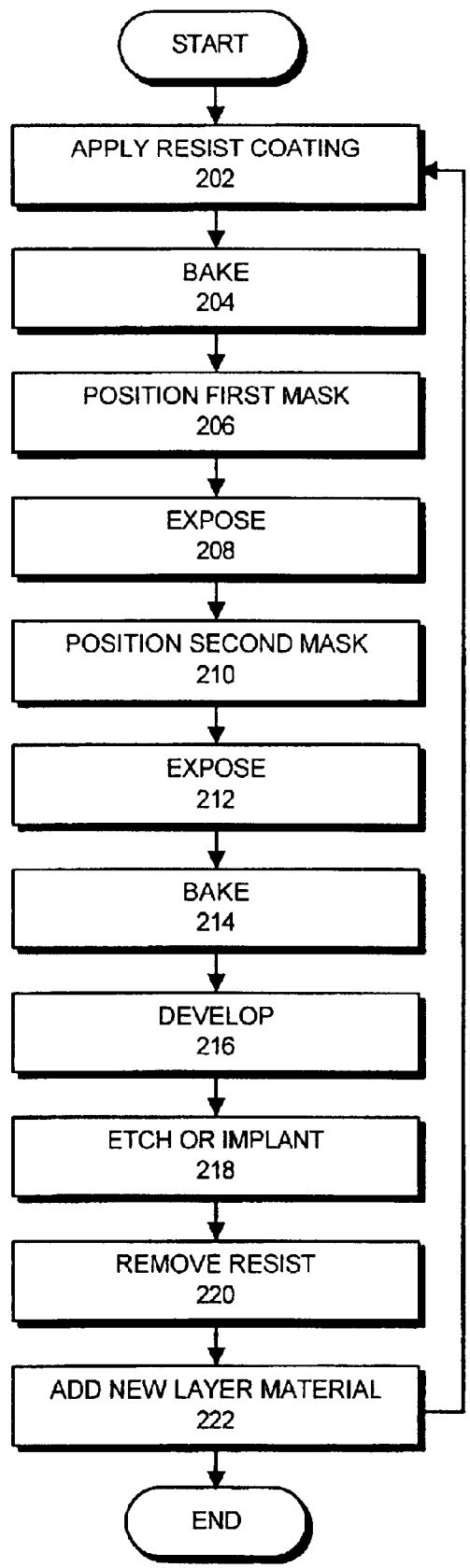
FIG. 2 is a flow chart illustrating the wafer fabrication process in accordance with an embodiment of the invention.

FIG. 2 is a flow chart illustrating the wafer fabrication process in accordance with an embodiment of the invention. The system starts by applying a photoresist layer to the top surface of a wafer (step 202). Next, the system bakes the photoresist layer (step 204). The system then positions the first mask over the photoresist layer (step 206), and exposes the photoresist layer through the first mask (step 208). Next, the system positions the second mask over the photoresist layer (step 210), and then exposes the photoresist layer through the second mask (step 212). Steps 210 and 212 are optional for layers where only a single mask will be used to define the material in the layer. In one embodiment of the invention, the first mask is a PSM mask and the second mask is a trim mask. However, note that the first mask and/or the second mask can include phase shifting regions. Next, the system optionally bakes the wafer again (step 214) before developing the photoresist layer (step 216). Next, either a chemical etching or ion implantation step takes place (step 218) before the photoresist layer is removed (step 220). (Note that in the case of a lift-off process, a deposition can take place.) Finally, a new layer of material can be added and the process can be repeated for the new layer (step 222).

Design Process

Figure 3:
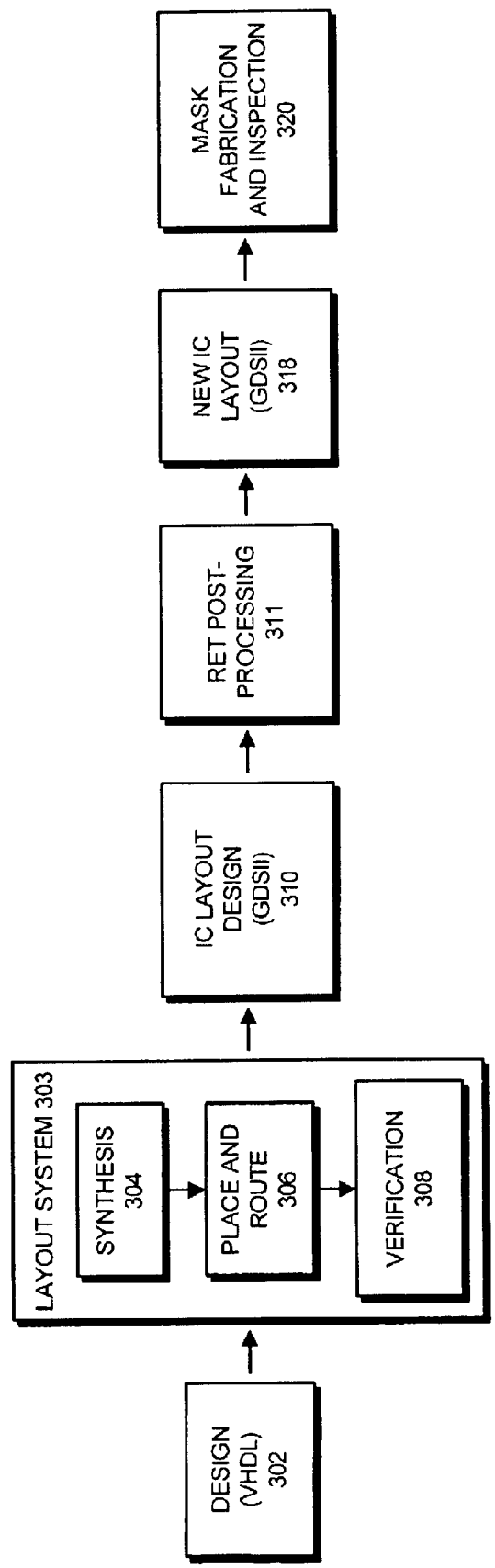
FIG. 3 illustrates the process of creating a mask to be used in fabricating an integrated circuit in accordance with an embodiment of the invention.

FIG. 3 illustrates the process of creating a mask to be used in the wafer fabrication process described above in accordance with an embodiment of the invention. The process starts when a circuit designer produces a design 302 in VHDL, or some other hardware description language. VHDL is an acronym for VHSIC Hardware Description Language. (VHSIC is a Department of Defense acronym that stands for very high-speed integrated circuits.) The VHDL standard has been codified in Institute for Electrical and Electronic Engineers (IEEE) standard 1076-1993.

Design 302 then feeds through a layout system 303 that performs a number of functions, such as synthesis 304, placement and routing 306 and verification 308. The result is an integrated circuit (IC) layout 310, which is in the form of a specification expressed in a format such as the hierarchical GDSII format.

IC layout 310 then passes into RET post-processing system 311, which can perform resolution enhancement techniques (RETs) to facilitate printing of the IC layout 310 on the finished wafer. At step 311, the IC layout 310 can be processed for phase shifting (e.g. alternating aperture dark field phase shifting) as well as OPC to compensate for proximity effects that arise during the wafer production process. (Although the term "optical proximity correction is used," more generally the term as used herein refers to correction for any specified proximity effects, e.g. optical, micro-loading, etch, resist, etc.)

The output of RET post-processing system 311 is a new IC layout 318. New IC layout 318 subsequently passes into mask fabrication and inspection processes 320.

Use of a Second Exposure

Figure 4:
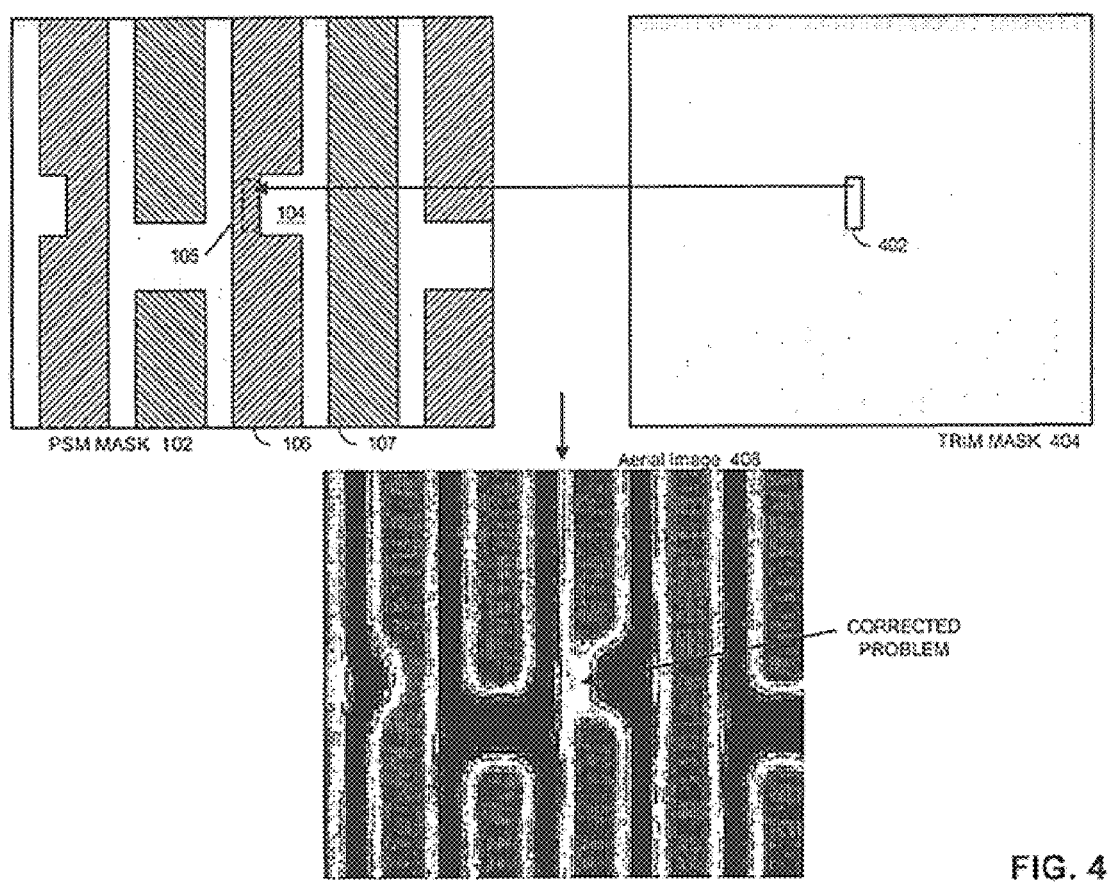
FIG. 4 illustrates how a second exposure can be used to help in printing a tight space adjacent to a large feature in accordance with an embodiment of the present invention.

FIG. 4 illustrates how a second exposure can be used to help in printing a tight space adjacent to a large feature in accordance with an embodiment of the present invention. The PSM mask 402 is shown again in FIG. 4 for reference purposes. As discussed above, the distance across feature 104 is large enough to degrade the effectiveness of phase shifting in defining boundaries of feature 104. This large distance reduces the destructive interference between phase shifters 106 and 107, which consequently degrades the contrast of the light that is used to define the boundaries of feature 104. The resulting problems in reliably printing the boundaries of large feature 104 cause corresponding problems in reliably printing the tight space 105 adjacent to large feature 104.

The first solution used by embodiments of the invention to this problem is to use a second exposure through an opening 402 in a trim mask 404 to assist in exposing tight space 105. (Note that the position of opening 402 in relation to the PSM mask 102 is shown on the PSM mask 102 in FIG. 4 as a dotted rectangular region.) Note that exposure through opening 402 may be "sub-resolution," which means that it will not print on its own. However, when the second exposure through trim mask 404 is added to the exposure through PSM mask 102, it improves the exposure of tight space 105, so that tight space 105 prints more reliably as is indicated by the arrow in aerial image 408. The effectiveness of the opening 402 can be best seen by comparing the aerial image 108 and the aerial image 408. As can be seen the bridging problem visible in aerial image 408 has been eliminated.

Second Exposure with Assist Features

Figure 5:
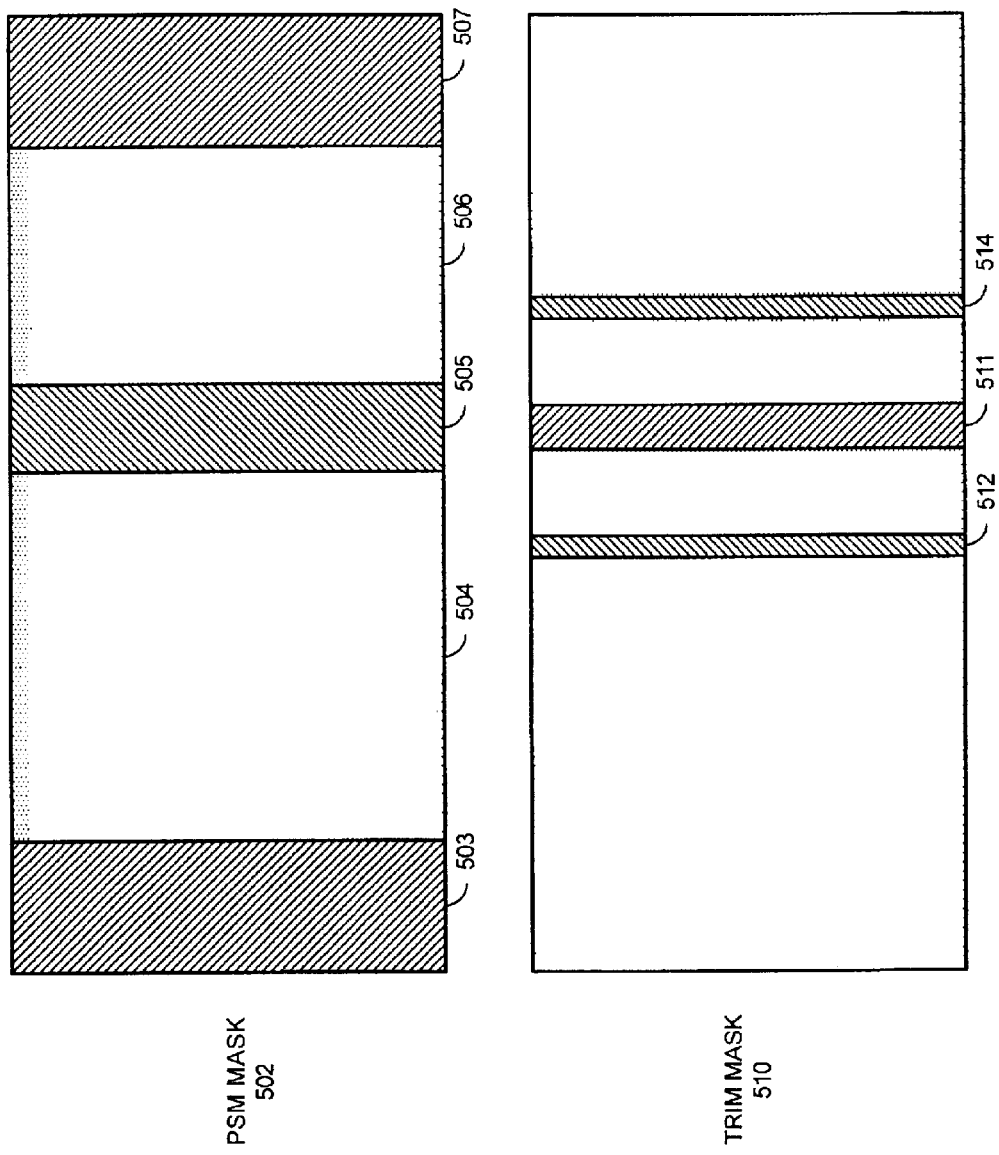
FIG. 5 illustrates how assist features can be used in the second mask in accordance with an embodiment of the present invention.

FIG. 5 illustrates how assist features can be used in the second mask in accordance with an embodiment of the present invention. FIG. 5 illustrates a PSM mask 502 that exposes, or defines, a first feature, which resides under chrome region 504 between zero-degree phase region 503 and 180-degree phase region 505. PSM mask 502 is also exposes as second feature, which resides under chrome region 506 between 180-degree phase region 505 and zero-degree phase region 507. Note that the distance across the first feature under chrome region 504 (between neighboring phase shifters 503 and 505) is large enough to degrade the effectiveness of phase shifting in defining boundaries of the first feature. Similarly, the distance across the second feature under chrome region 506 (between neighboring phase shifters 505 and 507) may also be large enough to degrade the effectiveness of phase shifting in defining boundaries of the second feature under chrome region 506. Hence, there is likely to be a problem in printing the tight space between the first feature and the second feature under 180-degree phase region 505.

To alleviate this problem, one embodiment of the invention uses a second exposure through trim mask 510 to better expose the tight space under 180-degree phase region 505. As is illustrated in FIG. 5, trim mask 510 includes a zero-degree phase region 511 centered over the tight space, as well as two 180-degree phase regions 512 and 514 that straddle zero-degree phase region 511. These regions are separated by chrome.

The two 180-degree phase regions 512 and 514 function as "assist features," because they "assist" zero-degree phase region 511 in printing the tight space. However, the two 180-degree phase regions 512 and 514 do not directly print underlying features themselves because they are sub-resolution. (Moreover, even though assist features 512 and 514 illustrated in FIG. 5 are out-of-phase with zero-degree phase region 511, it is also possible for assist features to be in-phase.)

During the second exposure, zero-degree phase region 511 and 180-degree phase regions 512 and 514 create destructive interference to sharply define the tight space under 180-degree phase region 505 on PSM mask 502.

Note that regions 511, 512 and 514 on trim mask 510, which help in printing the tight space under 180-degree phase region 505 on PSM mask 502, can be generated during the RET post-processing operation illustrated in box 311 in FIG. 3.

In deciding whether to use assist features, a compromise must be made between mask complexity and improvements in printing. Adding assist features complicates data conversion and mask fabrication on one hand, but on the other hand improves the definition of the cuts.

Tight Space Adjacent to a Critical Feature

Figure 6:
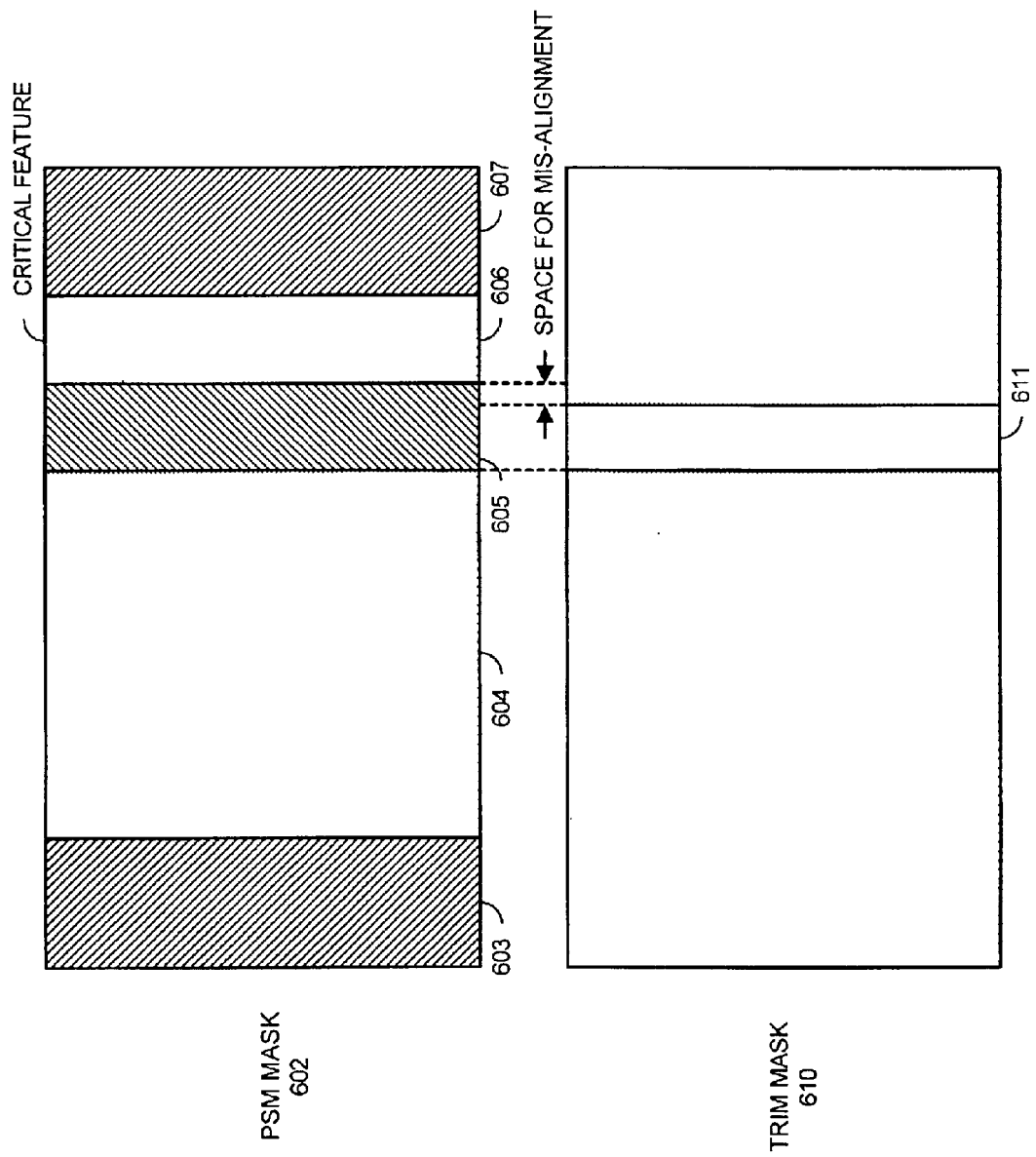
FIG. 6 illustrates an example where the tight space is adjacent to a critical feature in accordance with an embodiment of the present invention.

FIG. 6 illustrates an example where the tight space is adjacent to a critical feature in accordance with an embodiment of the present invention. In this example, PSM mask 602 exposes a first feature that resides under chrome region 604 (between zero-degree phase region 603 and 180-degree phase region 605). PSM mask 602 also exposes as second feature that resides under chrome region 606 (between 180-degree phase region 605 and zero-degree phase region 607).

Note that the distance across the feature under chrome region 604 (between neighboring phase shifters 603 and 605) is large enough to degrade the effectiveness of phase shifting in defining boundaries of the feature. This degradation can cause problems in printing the tight space under 180-degree phase region 605 between the first feature and the second feature.

To alleviate this problem, one embodiment of the invention uses a second exposure through trim mask 610 to better expose the tight space under 180-degree phase region 605. In this case, trim mask 610 includes a zero-degree phase region 611 which is aligned over the tight space during the exposure process. However, note that zero-degree phase region 611 is aligned over the boundary of chrome region 604, but not over the boundary of chrome region 606. This is purposely done because the feature under chrome region 606 is a "critical dimension feature," which is sensitive to alignment problems between trim mask 610 and PSM mask 602. Hence, in this example, trim mask 610 leaves space to accommodate potential alignment problems (as is illustrated by the arrows in FIG. 6).

Note that region 611 on trim mask 610, which helps in printing the tight space under 180-degree phase region 605 on PSM mask 602, can be generated during the RET post-processing operation illustrated in box 311 in FIG. 3.

Alternative Embodiments and Conclusion

The foregoing description is presented to enable one to make and use the invention, and is provided in the context of a particular application and its requirements. It is not intended to be exhaustive or to limit the invention to the forms disclosed. Various modifications to the disclosed embodiments will be readily apparent, and the general principles defined herein may be applied to other embodiments and applications without departing from the spirit and scope of the invention. Thus, the invention is not intended to be limited to the embodiments shown, but is to be accorded the widest scope consistent with the principles and features disclosed herein. Accordingly, many modifications and variations will be apparent. The scope of the invention is defined by the appended claims.

The data structures and code described in this detailed description can be stored on a computer readable storage medium, which may be any device or medium that can store code and/or data for use by a computer system. This includes, but is not limited to, magnetic and optical storage devices such as disk drives, magnetic tape, CDs (compact discs) and DVDs (digital versatile discs or digital video discs), and computer instruction signals embodied in a transmission medium (with or without a carrier wave upon which the signals are modulated). For example, the transmission medium may include a communications network, such as the Internet.

Note that the invention can be applied to any type of lithographic process for fabricating semiconductor chips, including processes that make use of, deep-ultraviolet (DUV) radiation, extreme ultraviolet (EUV) radiation, and X-rays, along with suitably modified masks.

What is claimed is:

1. A method for using an exposure through a second mask to assist an exposure through a phase shifting mask in printing a tight space adjacent to a large feature, comprising:

exposing a photoresist layer on the surface of a semiconductor wafer through the phase-shifting mask, wherein the phase-shifting mask includes phase shifters that define a space between a first feature and a second feature;

wherein the first feature is sufficiently large that the effectiveness of phase shifting is degraded in defining the space;

wherein the degradation in phase shifting and the tightness of the space cause the space not to print reliably when exposed through the phase shifting mask alone; and exposing the photoresist layer through the second mask, wherein the exposure through the second mask assists in exposing the space between the first feature and the second feature so that the space prints reliably.

2. The method of claim 1, wherein the second mask includes an opening located over the space to assist in exposing the space on the photoresist layer.

3. The method of claim 2, wherein the second mask additionally includes one or more assist features, which are not located over the space, yet assist in printing the space.

4. The method of claim 3, wherein the assist features can be either in-phase or out-of-phase with light passing through the opening in the second mask.

5. The method of claim 3, wherein the assist features are sub-resolution.

6. The method of claim 2, wherein the opening in the second mask can be sub-resolution.

7. The method of claim 2, wherein if the second feature is a critical dimension feature, the opening in the second mask is offset from the second feature, so that alignment problems between the phase shifting mask and the second mask do not affect printing of the critical dimension feature.

8. The method of claim 1, further comprising performing an optical proximity correction (OPC) operation for segments on the phase shifting mask.

9. The method of claim 8, wherein the method further comprises one of the following:

not performing an OPC operation for any segments on the second mask;

performing an OPC operation only for segments on the second mask that abut an original layout; and performing an OPC operation for all segments on the second mask.

10. A set of masks for use in a semiconductor fabrication process that uses an exposure through a second mask to assist an exposure through a phase shifting mask in printing a tight space adjacent to a large feature, comprising:

the phase-shifting mask, wherein the phase-shifting mask includes phase shifters that define a space between a first feature and a second feature;

wherein the first feature is sufficiently large that the effectiveness of phase shifting is degraded in defining the space;

wherein the degradation in phase shifting and the tightness of the space cause the space not to print reliably when exposed through the phase shifting mask alone; and the second mask, wherein the exposure through the second mask assists in exposing the space between the first feature and the second feature so that the space prints reliably.

11. The set of masks of claim 10, wherein the second mask includes an opening located over the space to assist in exposing the space on the space.

12. The set of masks of claim 11, wherein the second mask additionally includes one or more assist features, which are not located over the space, yet assist in printing the space.

13. The set of masks of claim 12, wherein the assist features can be either in-phase or out-of-phase with light passing through the opening in the second mask.

14. The set of masks of claim 12, wherein the assist features are sub-resolution.

15. The set of masks of claim 12, wherein if the second feature is a critical dimension feature, the opening in the second mask is offset from the second feature, so that alignment problems between the phase shifting mask and the second mask do not affect printing of the critical dimension feature.

16. The set of masks of claim 11, wherein the opening in the second mask can be sub-resolution.

17. The set of masks of claim 10, wherein segments on the phase shifting mask have been subjected to an optical proximity correction (OPC) operation.

18. The set of masks of claim 17, wherein one of the following has been performed for segments on the second mask:

no OPC has been performed for any segments on the second mask;

OPC has been performed only for segments on the second mask that abut an original layout; and OPC has been performed for all segments on the second mask.

19. A computer-readable storage medium storing instructions that when executed by a computer cause the computer to perform a method to create a second mask to assist a phase shifting mask in printing a tight space adjacent to a large feature, the method comprising:

receiving a specification of a layout for an integrated circuit;

producing phase-shifting mask for the layout, wherein the phase-shifting mask includes phase shifters that define a space between a first feature and a second feature in the layout;

wherein the first feature is sufficiently large that the effectiveness of phase shifting is degraded in defining the space;

wherein the degradation in phase shifting and the tightness of the space cause the space not to print reliably when exposed through the phase shifting mask alone; and producing a second mask, wherein the exposure through the second mask assists in exposing the space between the first feature and the second feature so that the space prints reliably.

20. The computer-readable storage medium of claim 19, wherein the second mask includes an opening located over the space to assist in exposing the space.

21. The computer-readable storage medium of claim 20, wherein the second mask additionally includes one or more assist features, which are not located over the space, yet assist in printing the space.

22. The computer-readable storage medium of claim 21, wherein the assist features can be either in-phase or out-of-phase with light passing through the opening in the second mask.

23. The computer-readable storage medium of claim 21, wherein the assist features are sub-resolution.

24. The computer-readable storage medium of claim 20, wherein the opening in the second mask can be sub-resolution.

25. The computer-readable storage medium of claim 20, wherein if the second feature is a critical dimension feature, the opening in the second mask is offset from the second feature, so that alignment problems between the phase shifting mask and the second mask do not affect printing of the critical dimension feature.

26. The computer-readable storage medium of claim 19, wherein the method further comprises performing an optical proximity correction (OPC) operation for segments on the phase shifting mask.

* * * * *

UNITED STATES PATENT AND TRADEMARK OFFICE
CERTIFICATE OF CORRECTION

PATENT NO. : 6,821,689 B2
DATED : Novemberr 23, 2004
INVENTOR(S) : Christophe Pierrat It is certified that error appears in the above-identified patent and that said Letters Patent is hereby corrected as shown below:

Column 8,
After line 47, add Claims 27 and 28 as shown below:

-- 27. The computer-readable storage medium of claim 19, wherein the method further comprises one of the following.

not performing an OPC operation for any segments on the second mask;

performing an OPC operation only for segments on the second mask that abut an original layout; and performing an OPC operation for all segments on the second mask.

28. An integrated circuit created through a process that uses an exposure through a second mask to assist an exposure through a phase shifting mask in printing a tight space adjacent to a large feature, the process comprising:

exposing a photoresist layer on the surface of a semiconductor wafer through the phase-shifting mask, wherein the phase-shifting mask includes phase shifters that define a space between a first feature and a second feature;

wherein the first feature is sufficiently large that the effectiveness of phase shifting is degraded in defining the space;

wherein the degradation in phase shifting and the tightness of the space cause the space not to print reliably when exposed through the phase shifting mask alone; and exposing the photoresist layer through the second mask, wherein the exposure through the second mask assists in exposing the space between the first feature and the second feature so that the space prints reliably. --

Signed and Sealed this

Twenty-eighth Day of June, 2005

JON W. DUDAS
*Director of the United States Patent and Trademark Office*